(12) United States Patent
Nakano et al.

(10) Patent No.: US 9,123,510 B2
(45) Date of Patent: Sep. 1, 2015

(54) METHOD FOR CONTROLLING IN-PLANE UNIFORMITY OF SUBSTRATE PROCESSED BY PLASMA-ASSISTED PROCESS

(71) Applicant: ASM IP Holding B.V., Almere (NL)

(72) Inventors: Ryu Nakano, Sagamihara (JP); Naoki Inoue, Hachioji (JP)

(73) Assignee: ASM IP HOLDING, B.V., Almere (NL)

( * ) Notice: Subject to any disclaimer, the term of this patent is extended or adjusted under 35 U.S.C. 154(b) by 23 days.

(21) Appl. No.: 13/915,732

(22) Filed: Jun. 12, 2013

(65) Prior Publication Data

US 2014/0367359 A1    Dec. 18, 2014

(51) Int. Cl.
*C23C 16/509*  (2006.01)
*H01J 37/32*  (2006.01)
*C23C 16/455*  (2006.01)
*C23C 16/458*  (2006.01)

(52) U.S. Cl.
CPC ....... *H01J 37/32449* (2013.10); *C23C 16/4551* (2013.01); *C23C 16/4585* (2013.01); *C23C 16/5096* (2013.01); *H01J 37/32431* (2013.01)

(58) Field of Classification Search
CPC ............ C23C 16/509; C23C 16/45563; C23C 16/45597
See application file for complete search history.

(56) References Cited

U.S. PATENT DOCUMENTS

| 5,494,494 | A  | * | 2/1996  | Mizuno et al. ............... 438/680 |
| 5,574,247 | A  | * | 11/1996 | Nishitani et al. ............. 118/708 |
| 6,899,507 | B2 | * | 5/2005  | Yamagishi et al. ........... 414/217 |
| 7,021,881 | B2 |   | 4/2006  | Yamagishi |
| 2002/0114886 | A1 | * | 8/2002 | Chou et al. ............. 427/255.391 |
| 2009/0156015 | A1 | * | 6/2009 | Park et al. .................... 438/758 |

* cited by examiner

*Primary Examiner* — David Turocy
(74) *Attorney, Agent, or Firm* — Snell & Wilmer LLP

(57) ABSTRACT

A method for controlling in-plane uniformity of a substrate processed by plasma-assisted process in a reactor, includes: supplying a principal gas to a reaction space, and discharging radially the principal gas from the reaction space through an annular duct; and supplying an secondary gas to the reaction space from an area in close proximity to an outer periphery of a susceptor, outside an outer circumference of the substrate as viewed from above, so as to flow at least partially in an inward direction passing the outer circumference of the substrate, reversing the direction of the secondary gas to flow toward the annular duct in a vicinity of the outer circumference of the substrate, and discharging radially the secondary gas together with the principal gas from the reaction space through the annular duct.

10 Claims, 9 Drawing Sheets

(4 of 9 Drawing Sheet(s) Filed in Color)

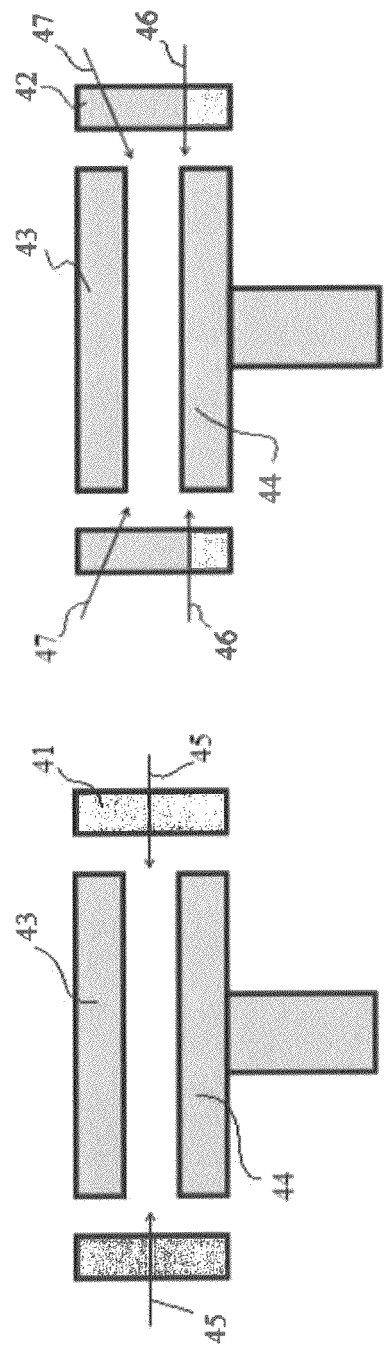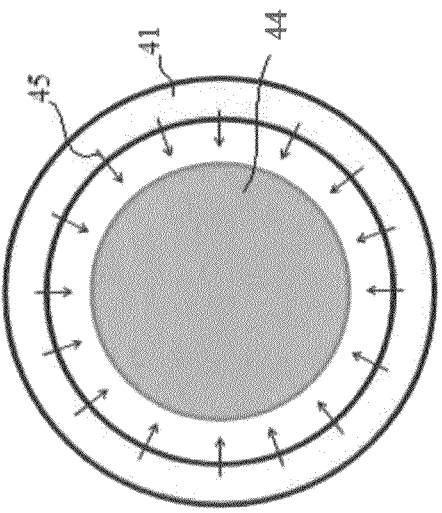

Separation ring clearance:10mm
| Seal-He [sccm] | 200 | 600 | 1200 |
|---|---|---|---|
| Unifomity [ ±%] | 2.48 | 2.54 | 2.60 |
| 2D Map EE3mm | | | |
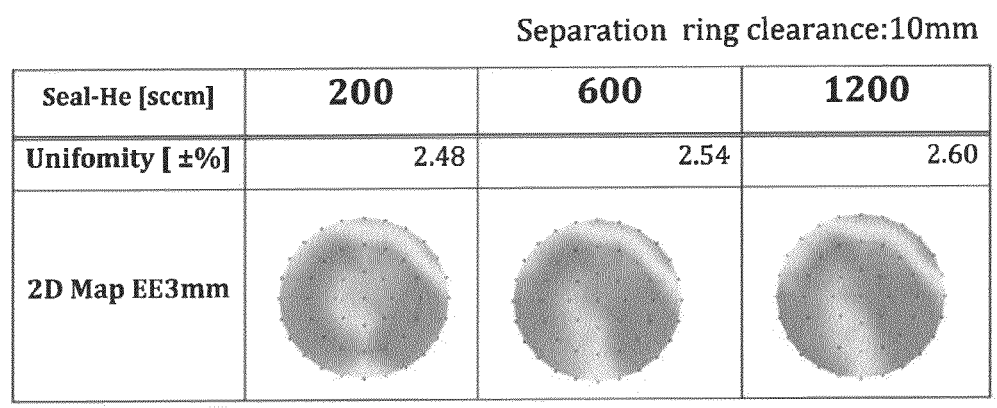
Separation ring clearance : 5mm
| Seal-He [sccm] | 100 | 600 | 1200 |
|---|---|---|---|
| Unifomity [ ±%] | 2.64 | 2.16 | 1.12 |
| 2D Map EE3mm | | | |
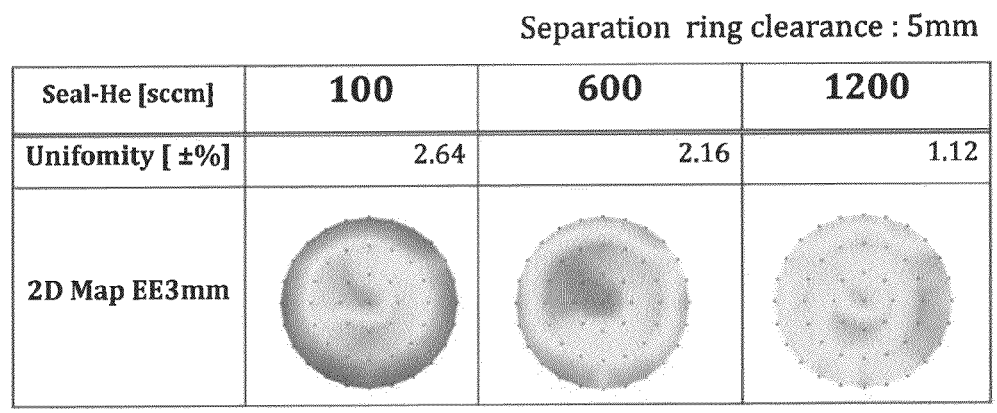
Fig. 12

METHOD FOR CONTROLLING IN-PLANE UNIFORMITY OF SUBSTRATE PROCESSED BY PLASMA-ASSISTED PROCESS

BACKGROUND OF THE INVENTION

1. Field of the Invention

The present invention generally relates to a method for processing a substrate by plasma-assisted process, such as plasma-assisted deposition and plasma-assisted etching, particularly to a method for controlling in-plane uniformity of a substrate subjected to such processing.

2. Description of the Related Art

In a plasma-enhanced atomic layer deposition (PEALD), RF power is an important parameter for controlling the quality of a film depositing by PEALD. In general, high RF power and prolonged duration of plasma exposure contribute to good quality of a film. However, according to the present inventors' experience, when RF power is high, an area of the film near the outer periphery has a thickness greater than that of other areas of the film, i.e., in-plane uniformity of thickness of a film is degraded. Although the reasons for such in-plane unevenness of thickness of a film are unknown, the present inventors expect that unevenness of thickness may be caused by uneven adsorption of a material over a substrate surface due to uneven distributions of plasma and/or uneven activation on the substrate surface, or insufficient purge around the outer periphery of the substrate. Further, in trimming photoresist and carbon film, the etch rate of a film on a substrate is higher near the outer periphery of the substrate than inner areas of the substrate.

The above and any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

To solve the above problems, in some embodiments, a deposition rate or etching rate of a film formed on a substrate in an area near the outer periphery of the substrate is controlled by increasing the flow rate of seal gas which is a gas jetting from a port provided at a location below the substrate and/or nearly flush with the substrate in a vicinity of the outer periphery of the substrate. In this disclosure, a gas which is used for controlling partial pressure and/or flux of gas near the outer circumference of a substrate and which is not used for processing the substrate (since this gas does not reach a central area and an inner area around the central area of the substrate surface) may be referred to as a "secondary gas". By doing the above, partial pressure and flux of gas near the outer periphery of a substrate can effectively be controlled. In some embodiments, in addition to a showerhead for supplying a main process gas, at least one separate port for supplying a secondary gas is provided in a reaction chamber. Multiple ports (e.g., 3 to 30, preferably 10 to 20) for supplying a secondary gas can be provided along a circumferential direction of a substrate and/or along a vertical direction, thereby controlling in-plane uniformity of the substrate more precisely.

In some embodiments, by narrowing a clearance between the inner periphery of a separation ring which is provided around a susceptor and divides a reaction chamber and a transfer chamber, and the outer periphery of the susceptor, partial pressure or flux of gas in a vicinity of the outer periphery of the substrate can be controlled as effectively as when a separate port for supplying a secondary gas is provided in a bottom area of the reaction chamber or in an area of the reaction chamber flush with the substrate in a vicinity of the outer periphery of the substrate. By changing the clearance between the inner periphery of the separation ring and the outer periphery of the susceptor or changing the arrangement of the separate ports for circumferentially changing the supply quantity of secondary gas along the outer periphery of the substrate, more precise control over in-plane uniformity of the substrate can be achieved. For example, as viewed from above, a clearance between the inner periphery of the separation ring and the outer periphery of the susceptor can be set to be narrower in a portion of the clearance defined between a twelve o'clock direction and a three o'clock direction, and/or set to be wider in a portion of the clearance defined between a six o'clock direction and a nine o'clock direction, relative to the other portions of the clearance, so that the effect of the secondary gas can be enhanced in an area near the outer periphery of the substrate defined between a twelve o'clock direction and a three o'clock direction, thereby controlling in-plane uniformity of the substrate more directionally and precisely. In the above, the clearance can be divided in smaller sections than quadrants such as a section defined between a twelve o'clock direction and a one or two o'clock direction.

Any suitable gas can be used as the secondary gas, including, but not limited to, a rare gas such as Ar and He, and other inert gases such as $N_2$.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

The patent or application file contains at least one drawing executed in color. Copies of this patent or patent application publication with color drawing(s) will be provided by the Office upon request and payment of necessary fee.

FIG. 4A is a schematic cross sectional side view of a plasma-assisted processing apparatus wherein an arrow illustrates secondary-gas flow according to an embodiment of the present invention.

FIG. 4B is a schematic cross sectional top view of the plasma-assisted processing apparatus illustrated in FIG. 4A.

FIG. 5 is a schematic cross sectional side view of a plasma-assisted processing apparatus wherein an arrow illustrates secondary-gas flow according to another embodiment of the present invention.

FIG. 12 shows images of thin-film thickness profile measurement by 2D color map analysis of films formed by plasma-enhanced chemical vapor deposition (PECVD) under different conditions.

DETAILED DESCRIPTION OF EMBODIMENTS

Figure 1:
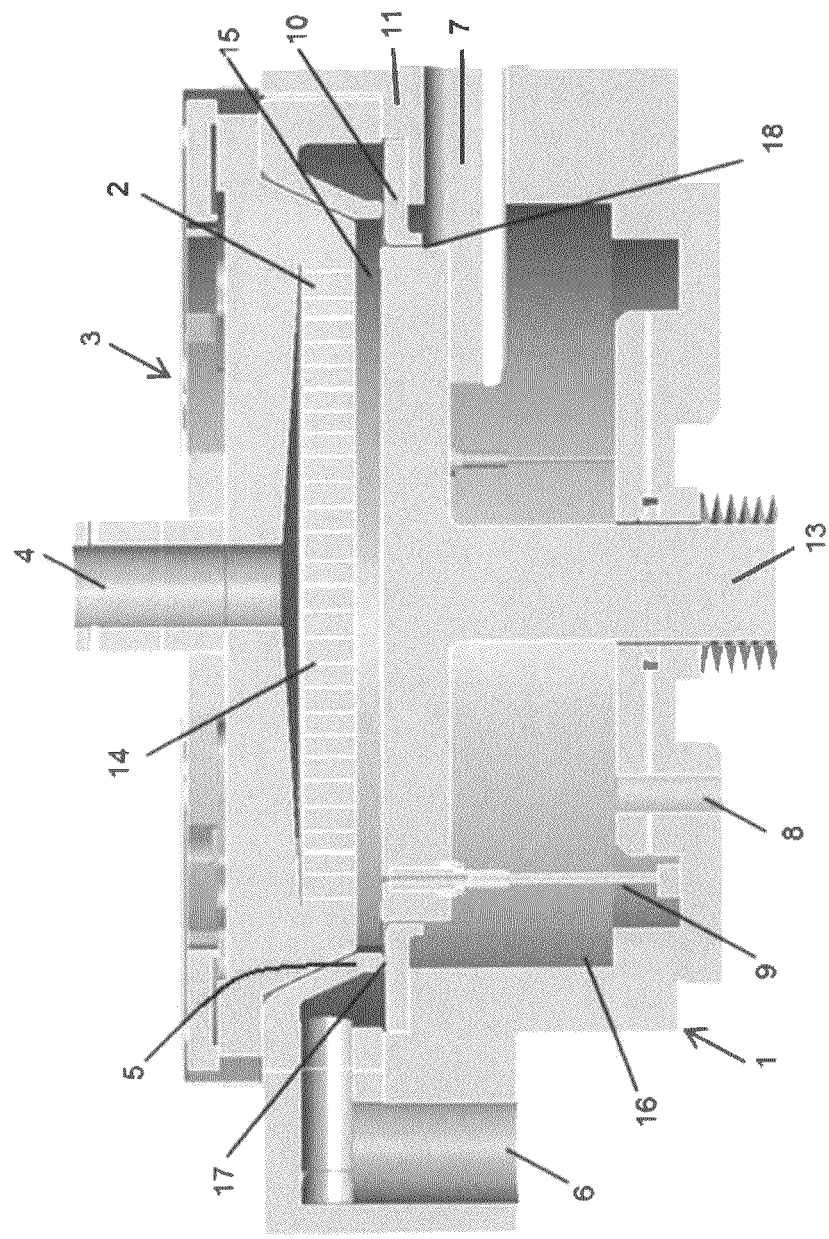
FIG. 1 is a schematic cross sectional view illustrating a plasma-assisted processing apparatus according to an embodiment of the present invention.

In this disclosure, "gas" may include vaporized solid and/or liquid and may be constituted by a single gas or a mixture of gases. Likewise, an article "a" or "an" refers to a species or a genus including multiple species. Multiple gases can be introduced as a mixed gas or separately to a reaction space. In some embodiments, "film" refers to a layer continuously extending in a direction perpendicular to a thickness direction substantially without pinholes to cover an entire target or concerned surface, or simply a layer covering a target or concerned surface. In this disclosure, a "substrate" refers to a material (typically planar) on which a process is conducted, regardless of whether a film or films is/are formed on the top surface, or whether the surface is patterned. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

As described above, in some embodiments of the present invention, partial pressure and flux of gas in a vicinity of the outer periphery of a substrate are controlled in order to control in-plane uniformity of the substrate. An embodiment of the present invention provides a method for controlling in-plane uniformity of a substrate processed by plasma-assisted process in a reactor comprising: a susceptor and a showerhead disposed in parallel facing each other and conductively coupled for plasma discharge in a reaction space formed between the susceptor and the showerhead; and an annular duct circularly surrounding the susceptor. The method comprises: (i) supplying a principal gas for plasma-assisted process of a substrate placed on the susceptor, to the reaction space through the showerhead, and discharging radially the principal gas from the reaction space through the annular duct; and (ii) supplying a secondary gas to the reaction space from an area in close proximity to an outer periphery of the susceptor, outside an outer circumference of the substrate as viewed from above, so as to flow at least partially in an inward direction passing the outer circumference of the substrate, reversing the direction of the secondary gas to flow toward the annular duct in a vicinity of the outer circumference of the substrate, and discharging radially the secondary gas together with the principal gas from the reaction space through the annular duct. The "principal gas" refers to a gas including an active gas used for plasma-assisted process of a substrate placed on the susceptor, and without the gas, the intended plasma-assisted process is not accomplished. The plasma-assisted process includes, but is not limited to, film-forming process, film-etching process, surface-treating process, and ashing process. The "secondary gas" refers to a gas which is not indispensable or necessary for accomplishing the plasma-assisted process and which can control or enhance operation of the process, and without the gas, the plasma-assisted process can be accomplished. The secondary gas may be referred to also as seal gas or control gas depending on its intended use. The "in-plane uniformity" includes, but is not limited to, in-plane uniformity of thickness of a film deposited or etched on a substrate, and in-plane uniformity of physical or chemical properties of a film formed on a substrate or a surface of a substrate. Also, in this disclosure, "controlling in-plane uniformity" refers to increasing in-plane uniformity, decreasing in-plane uniformity, maintaining in-plane uniformity, or other control over in-plane uniformity, depending on the intended purpose. For example, according to some embodiments of the present invention, the surface of a film can be not only flat, but also convex or concave, depending on the intended purpose. The step of supplying the secondary gas is typically conducted during the step of supplying the principal gas, and may be conducted continuously; however, the step of supplying the secondary gas need not be continuously conducted throughout the process. For example, in plasma-enhanced atomic layer deposition (PEALD), a cycle of supplying the secondary gas may be synchronized with a cycle of supplying the principal gas, and during a plasma-exposing cycle, a cycle of supplying the secondary gas may be stopped in a manner similar to that in which a cycle of supplying the principal gas is stopped. Pulsing the supply of the secondary gas may more easily be accomplished in embodiments where the secondary gas is supplied through inflow ports disposed adjacent to an annular slit of the annular duct, rather than through the clearance between the susceptor and the separation ring.

In some embodiments, the secondary gas is introduced into the reaction space from outside the outer circumference of the substrate and flows at least partially in an inward direction, crossing over the outer circumference of the substrate. However, due to the principal gas flowing in a radial direction, and/or due to suction of gas in a radial direction by the annular duct, the secondary gas does not continue traveling in an inward direction, and the direction of the secondary gas is reversed to flow toward the annular duct in a vicinity of the outer circumference of the substrate, and then the secondary gas is radially discharged together with the principal gas from the reaction space through the annular duct. In the area along the outer circumference of the substrate, turbulent flow is generated by the secondary gas, thereby interfering with or resisting flow of the principal gas in the peripheral area (increasing the effect of the principal gas in a central and intermediate area) and/or increasing the effect of the secondary gas in the peripheral area for controlling in-plane uniformity of the substrate. For example, when a deposited or etched film on a substrate has uneven in-plane distribution of thickness where the surface of the film is concave (a film at the center is thinner and a film adjacent to the outer periphery is thicker as compared with the average of the thickness of the film), by changing flux of gas near the outer circumference of the substrate using the secondary gas, in-plane uniformity of thickness of the film can be substantially controlled. For example, in some reactors, when RF power for processing a substrate is about 400 W or higher, a resultant film of the substrate is likely to form a concave surface, and in-plane uniformity of the substrate is degraded. By applying any of the disclosed embodiments to the above processing, in-plane uniformity can significantly be controlled by increasing the effect of the principal gas in central and intermediate areas of a substrate and/or increasing the effect of the secondary gas in a peripheral area of the substrate. A skilled artisan can readily determine the conditions including RF power which cause the surface of the resultant film to be concave as a matter of routine experimentation.

In some embodiments, the reactor comprises a reaction chamber and a transfer chamber under the reaction chamber, wherein the reaction chamber and the transfer chamber are separated by a separation ring having an opening in which the susceptor is disposed and a top surface of the susceptor is approximately flush with the separation ring during the plasma-assisted process, wherein the secondary gas is supplied to the reaction space through a clearance between the separation ring and the susceptor at a flow rate such that the secondary gas enters the reaction space partially in the inward direction passing the outer circumference of the substrate, reverses direction to flow toward the annular duct in a vicinity of the outer circumference of the substrate, and is discharged radially together with the principal gas from the reaction space through the annular duct. Controlling flux of the secondary gas in the area around the outer circumference of the substrate by using the separation ring is advantageous since modification of an existing configuration can be minimal. In some embodiments, the clearance between the separation ring and the susceptor is no less than about 0.5 mm but less than about 10 mm (e.g., about 1.0 mm to about 7.0 mm, typically about 5.0 mm), depending on the configuration of the reactor. By narrowing the clearance, flux of the secondary gas can effectively be adjusted, since the quantity of the secondary gas supplied into the reaction space cannot be increased to the extent that the flow of the secondary gas interferes with the intended processing of the substrate using the principal gas.

In some embodiments, the clearance between the separation ring and the susceptor varies along the outer periphery of the susceptor to change the flow rate of the secondary gas along the outer periphery of the susceptor. This embodiment is effective especially when in-plane uniformity changes along the outer circumference of the substrate; for example, in-plane uniformity of an area of the substrate positioned near a gate valve and/or an area positioned near where an exhaust duct is located is different from that of other areas due to structural differences at the gate valve. To compensate for unevenness along a circumferential direction, in some embodiments, the clearance between the separation ring and the susceptor varies in a range of about 0.5 mm to about 10 mm, where the clearance is narrower in an area where the effect of the secondary gas is to be increased, whereas the clearance is greater in an area where the effect of the secondary gas is to be decreased. In some embodiments, a center of the separation ring is shifted from a center of the susceptor toward a gate valve disposed in a side wall of the transfer chamber, through which gate valve the substrate is taken into and out of the transfer chamber. The clearance can be adjusted circumferentially by a self-centering mechanism, for example.

In connection with the above embodiments, some embodiments provide a plasma-assisted processing apparatus for processing a substrate comprising: (a) a reaction chamber and a transfer chamber under the reaction chamber; (b) a susceptor for placing a substrate thereon, said susceptor being capable of moving in a vertical direction between the reaction chamber and the transfer chamber; (c) a showerhead facing the susceptor, disposed in parallel to the susceptor, and conductively coupled with the susceptor for plasma discharge in a reaction space formed between the susceptor and the showerhead; (d) an annular duct circularly surrounding the susceptor, for discharging gas from the reaction space; and (e) a separation ring for separating the reaction chamber and the transfer chamber, said separation ring having an opening in which the susceptor is disposed and a top surface of the susceptor is approximately flush with the separation ring during the plasma-assisted process, wherein a secondary gas is supplied to the reaction space through a clearance between the separation ring and the susceptor, wherein a clearance between the separation ring and the susceptor is no less than 0.5 mm but less than 10 mm. In some embodiments, the clearance between the separation ring and the susceptor varies along the outer periphery of the susceptor to change the flow rate of the secondary gas along the outer periphery of the susceptor. In some embodiments, a center of the separation ring is shifted from a center of the susceptor toward a gate valve disposed in a side wall of the transfer chamber, through which gate valve the substrate is taken into and out of the transfer chamber.

In some embodiments, the annular duct has an annular slit from which gas in the reaction space is sucked into the annular duct, which is disposed in a vicinity of the outer periphery of the susceptor substantially concentrically with the outer periphery of the susceptor so that the principal gas and the secondary gas both can be discharged from the reaction space through the annular slit. In some embodiments, the clearance of the annular slit is about 0.5 mm to about 5 mm, preferably about 1 mm to about 2 mm.

Alternative to or in combination with the above embodiments using the separation ring for supplying the secondary gas, in some embodiments, the reactor further comprises multiple inflow ports exposed to the reaction space near an opening of the annular duct along the annular duct, wherein the secondary gas is supplied to the reaction space through the multiple inflow ports in the inward direction passing the outer circumference of the substrate at a flow rate such that the secondary gas enters the reaction space, reverses direction to flow toward the annular duct in a vicinity of the outer circumference of the substrate, and is discharged radially together with the principal gas from the reaction space through the opening of the annular duct. In some embodiments, the inflow ports are installed at intervals of about 5 mm to about 100 mm, preferably about 10 mm to about 20 mm, along an inner wall surrounding the reaction space. The inflow ports may be disposed at the same intervals along a circumferential direction, or may be disposed at different intervals along a circumferential direction. In some embodiments, the inflow ports are multiple not only on a horizontal plane along the annular duct but also along a vertical direction. In some embodiments, the multiple inflow ports are allocated unevenly along the annular duct to change the flow rate of the secondary gas along the outer periphery of the susceptor. In some embodiments, the multiple inflow ports are allocated unevenly along the annular duct to change the flow rate of the secondary gas along the outer periphery of the susceptor. The above can be accomplished based on substantially similar principles to those in the embodiments where the clearance between the separation ring and the susceptor is adjusted, so that gas flow is adjusted along a circumferential direction. In some embodiments, the diameter of the inflow port is about 0.3 mm to about 3 mm, preferably about 0.5 mm to about 1 mm.

In some embodiments, the inflow ports are installed by inserting pipes through the interior of the annular duct until they are exposed to the reaction space in an area adjacent to the opening of the annular duct. The pipes may be set toward the center of the reaction space.

In connection with the above embodiments, some embodiments provide a plasma-assisted processing apparatus for processing a substrate comprising: (a) a reaction chamber and a transfer chamber under the reaction chamber, (b) a susceptor for placing a substrate thereon, said susceptor being capable of moving in a vertical direction between the reaction chamber and the transfer chamber; (c) a showerhead facing the susceptor, disposed in parallel to the susceptor, and conductively coupled with the susceptor for plasma discharge in a reaction space formed between the susceptor and the showerhead; (d) an annular duct circularly surrounding the susceptor, for discharging gas from the reaction space; and (e) multiple inflow ports exposed to the reaction space near an opening of the annular duct along the annular duct, wherein a secondary gas is supplied to the reaction space through the multiple inflow ports in an inward direction. In some embodiments, the multiple inflow ports are allocated unevenly along the annular duct to change the flow rate of the secondary gas along the outer periphery of the susceptor.

In some embodiments, the secondary gas is selected depending on its intended purpose. For example, for controlling in-plane uniformity of thickness of a resultant film of a substrate, an inert gas such as a rare gas (e.g., Ar, He) or other inert gas such as $N_2$ may be used as the secondary gas, and for plasma-assisted etching or ashing, or plasma-assisted surface treatment such as hydrophobic treatment, an oxidizing gas such as $O_2$ may be used as the secondary gas.

In some embodiments, the secondary gas is supplied at a flow rate of about 500 sccm or higher, preferably about 500 sccm to about 2000 sccm, for a 300-mm substrate, depending on the flow rate of the principal gas, suction by the annular duct, the configuration of the reactor, etc. In some embodiments, the flow rate of the secondary gas is less than that of the principal gas, and alternatively, the flow rate of the secondary gas is greater than that of the principal gas, depending on flux of the secondary gas, the adjusting degree of in-plane uniformity, etc. Suction by the annular duct can be adjusted so as to maintain the pressure of the reaction space during the process of the substrate.

In some embodiments, the plasma-assisted process is plasma-enhanced atomic layer deposition (PEALD), plasma-enhanced chemical vapor deposition (PECVD), plasma-assisted etching or ashing, or plasma-assisted surface treatment such as hydrophobic treatment.

In some embodiments, the in-plane uniformity of the substrate is such that in-plane uniformity of thickness of a processed film of the substrate is about 2.0% or less, about 1.5% or less, as 3σ uniformity.

The embodiments will be explained with respect to preferred embodiments. However, the present invention is not limited to the preferred embodiments.

FIG. 1 is a schematic cross sectional view illustrating a plasma-assisted processing apparatus according to an embodiment of the present invention. The apparatus comprises a transfer chamber 1 having an opening 7 with a gate valve (not shown) through which a substrate is taken in and taken out and also having a port 8 through which a secondary gas is supplied to the interior 16 of the transfer chamber 1; a reaction chamber 3 disposed on top of the transfer chamber 1; a susceptor 13 on which a substrate is loaded and which moves vertically between the reaction chamber 3 and the transfer chamber 1, wherein the susceptor 13 has vertical through-holes in which lift pins 9 are suspended and lift a substrate when the susceptor 13 descends in the transfer chamber 1 for taking in and out a substrate through the opening 7; a showerhead 2 installed in the reaction chamber, which has many through-holes 14 through which principal gas provided through a gas port 4 is supplied, wherein a reaction space 15 wherein a substrate is processed is formed between the susceptor 13 and the showerhead 2; an annular duct 5 for evacuating the reaction space 15, on which the showerhead 2 is placed, wherein the annular duct 5 has an annular slit 17 through which gas is discharged from the reaction space 15 via an exhaust port 6 connected to a vacuum pump (not shown); and a separation ring 10 which separates the reaction space and the interior 16 of the transfer chamber 1, wherein there is a clearance 18 between the outer periphery of the susceptor 13 and the inner periphery of the separation ring 10, through which clearance the secondary gas is introduced into the reaction space 15 from the interior 16 of the transfer chamber 1, and a top surface of the separation ring 10 forms a bottom of the annular slit 17. In this embodiment, by adjusting the clearance 18 and the flow rate of the secondary gas provided through the port 8, flux of the secondary gas supplied to the reaction space 15 through the clearance 18 can be adjusted so that the secondary gas can flow partially in an inward direction against outward flow of the principal gas after the secondary gas enters the reaction space 15. The principal gas is supplied to the reaction space 15 radially through the showerhead 2, and discharged through the annular slit 17 together with the secondary gas supplied to the reaction space 15.

A skilled artisan will appreciate that the apparatus includes one or more controller(s) (not shown) programmed or otherwise configured to cause the deposition or etching processes described elsewhere herein to be conducted. The controller(s) are communicated with the various power sources, heating systems, pumps, robotics and gas flow controllers or valves of the reactor, as will be appreciated by a skilled artisan.

Figure 2:
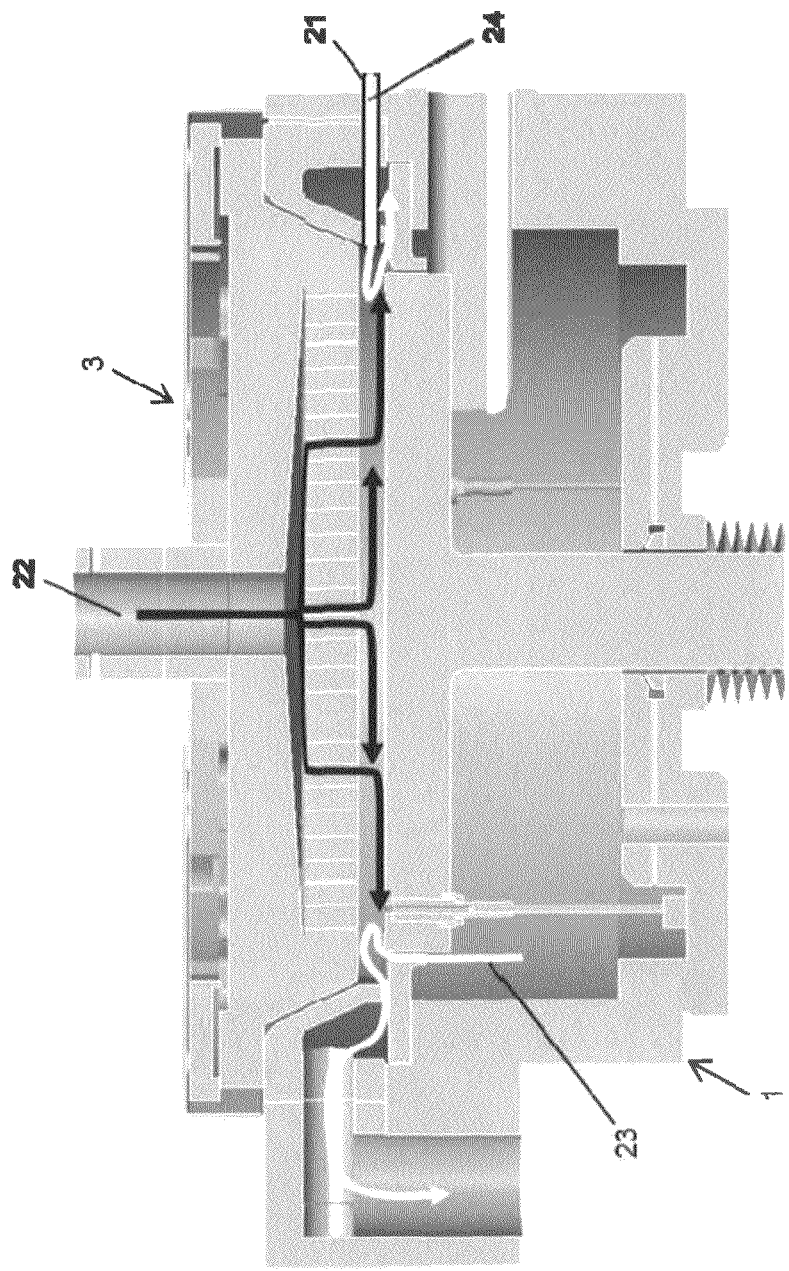
FIG. 2 is a schematic cross sectional view illustrating a plasma-assisted processing apparatus according to another embodiment of the present invention.

FIG. 2 is a schematic cross sectional view illustrating a plasma-assisted processing apparatus according to another embodiment of the present invention. In this embodiment, in addition to the separation ring 10, inflow ports 21 for supplying a secondary gas to the reaction space 15 are provided by inserting pipes through the annular duct 5 toward the center of the susceptor 13 and exposing openings of the pipes to the reaction space 15. In this embodiment, the apparatus has the separation ring 10, and the clearance 18 and the amount of the secondary gas are adjusted to create inward flow of the secondary gas against outward flow of the principal gas after the secondary gas enters the reaction space 15. The flow of the secondary gas is indicated by an arrow 23 (extremely oversimplified), wherein the secondary gas enters the reaction space 15 from the interior 16 of the transfer chamber 1, flows in an inward direction until passing the outer circumference of a substrate (not shown), reverses its direction due to the outward flow of the principal gas indicated by an arrow 22 and suction through the annular slit 17, and is discharged from the reaction space 15 together with the principal gas through the annular slit 17 to the annular duct 5, and then discharged through the exhaust port 6. In this embodiment, inflow ports 21 for supplying a secondary gas to the reaction space 15 are further provided by inserting pipes through the annular duct 5 toward the center of the susceptor 13 and exposing openings of the pipes to the reaction space 15. Multiple inflow ports 21 are provided along the annular duct 5. The secondary gas is supplied to the reaction space 15 through the inflow ports 21 in an inward direction, flows in the inward direction until passing the outer circumference of a substrate (not shown), reverses its direction due to the outward flow of the principal gas indicated by the arrow 22 and suction through the annular slit 17, and is discharged from the reaction space 15 together with the principal gas through the annular slit 17 to the annular duct 5, and then discharged through the exhaust port 6. In another embodiment, the processing is controlled so that the inward flow of the secondary gas after entering the reaction space 15 is created only by the inflow ports 21, not by the separation ring 10.

Figure 3A:
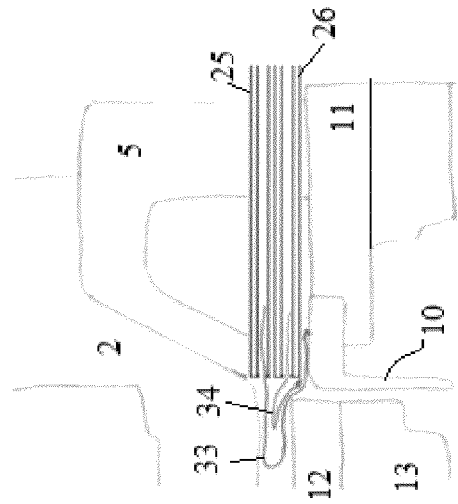
FIG. 3A is a schematic cross section of an annular duct area of a plasma-assisted processing apparatus wherein an arrow illustrates secondary-gas flow according to an embodiment of the present invention.
Figure 3B:
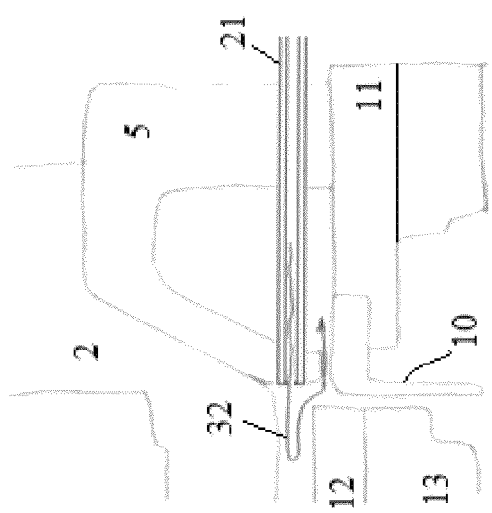
FIG. 3B is a schematic cross section of an annular duct area of a plasma-assisted processing apparatus wherein an arrow illustrates secondary-gas flow according to another embodiment of the present invention.
Figure 3C:
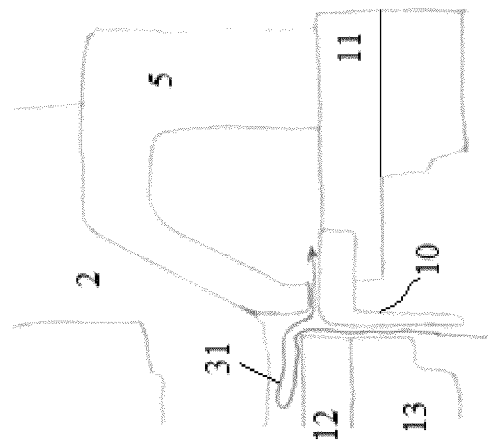
FIG. 3C is a schematic cross section of an annular duct area of a plasma-assisted processing apparatus wherein an arrow illustrates secondary-gas flow according to still another embodiment of the present invention.

FIG. 3A is a schematic cross section of an annular duct area of a plasma-assisted processing apparatus wherein an arrow illustrates secondary-gas flow using a separation ring according to an embodiment of the present invention. As explained above, also as indicated by an arrow 31, the secondary gas enters the reaction space through the clearance between the susceptor 13 and the separation ring 10 (which is supported by a support member 11), flows inward in the reaction space, reverses its direction, and is discharged through the slit formed between the annular duct 5 and the separation ring 10. FIG. 3B is a schematic cross section of an annular duct area of a plasma-assisted processing apparatus wherein an arrow illustrates secondary-gas flow using an inflow port according to another embodiment of the present invention. As explained above, also as indicated by an arrow 32, the secondary gas enters the reaction space through the inflow port 21, flows inward in the reaction space, reverses its direction, and is discharged through the slit formed between the annular duct 5 and the separation ring 10. FIG. 3C is a schematic cross section of an annular duct area of a plasma-assisted processing apparatus wherein an arrow illustrates secondary-gas flow using two vertically arranged inflow ports according to still another embodiment of the present invention. As indicated by an arrow 33, the secondary gas enters the reaction space through the upper inflow port 25, flows inward in the reaction space, reverses its direction, and is discharged through the slit formed between the annular duct 5 and the separation ring 10, while as indicated by an arrow 34, the secondary gas enters the reaction space through the lower inflow port 26, flows inward in the reaction space and pushes the flow of the secondary gas from the upper inflow port 25 further inward. The secondary gas from the lower inflow port 26 reverses its direction and is discharged together with the secondary gas from the upper inflow port 25 through the slit formed between the annular duct 5 and the separation ring 10.

FIG. 4A is a schematic cross sectional side view of a plasma-assisted processing apparatus wherein arrows illustrate secondary gas flow according to an embodiment of the present invention. Regardless of whether an annular duct is installed, inflow ports can be installed through a side wall 41 along the side wall so that as indicated by arrows 45, the secondary gas enters a reaction space defined between a showerhead 43 and a susceptor 44. FIG. 4B is a schematic cross sectional top view of the plasma-assisted processing apparatus illustrated in FIG. 4A. In this embodiment, 16 inflow ports are installed in the side wall toward the center of the susceptor. The inflow ports are evenly spaced along the circumference of the side wall. The inflow port can be in any shape such as a slit or a circular opening surrounding a substrate (the slit or opening may have an inner diameter of e.g., about 320 mm to about 350 mm for a 300-mm substrate). FIG. 5 is a schematic cross sectional side view of a plasma-assisted processing apparatus wherein arrows illustrate control gas flow according to another embodiment of the present invention. In this embodiment, upper and lower inflow ports are arranged so that the secondary gas enters the reaction space in two layers as indicated by arrows 46 and 47.

Figure 7:
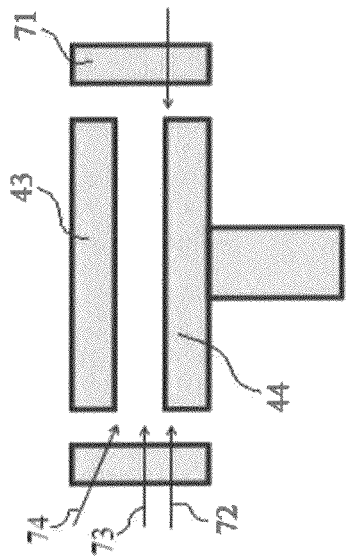
FIG. 7 is a schematic cross sectional side view of a plasma-assisted processing apparatus wherein an arrow illustrates secondary-gas flow according to another embodiment of the present invention.
Figure 6:
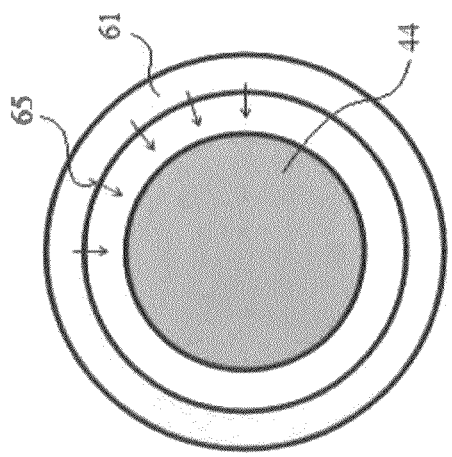
FIG. 6 is a schematic cross sectional top view of a plasma-assisted processing apparatus wherein an arrow illustrates secondary-gas flow according to an embodiment of the present invention.

FIG. 6 is a schematic cross sectional top view of a plasma-assisted processing apparatus wherein arrows illustrate control gas flow according to an embodiment of the present invention. In this embodiment, inflow ports are arranged only in a portion of a side wall 61 which is defined between a twelve o'clock direction and a three o'clock direction, so that as indicated by arrows 65, the secondary gas enters only a specific area of the reaction space where a portion of a substrate to be treated for controlling in-plane uniformity is positioned. FIG. 7 is a schematic cross sectional side view of a plasma-assisted processing apparatus wherein arrows illustrate control gas flow according to another embodiment of the present invention. In this embodiment, lower inflow ports are arranged all around the circumference of a side wall 71, so that as indicated by arrows 72, the secondary gas from the lower inflow ports enters the reaction space evenly around the circumference of the side wall 71. In addition, in this embodiment, middle inflow ports and upper inflow ports are arranged only in a portion of the side wall 71 which is defined between, for example, a twelve o'clock direction and a three o'clock direction, so that more secondary gas enters in a specific area of the reaction space where a portion of a substrate to be treated for controlling in-plane uniformity is positioned.

Figure 8:
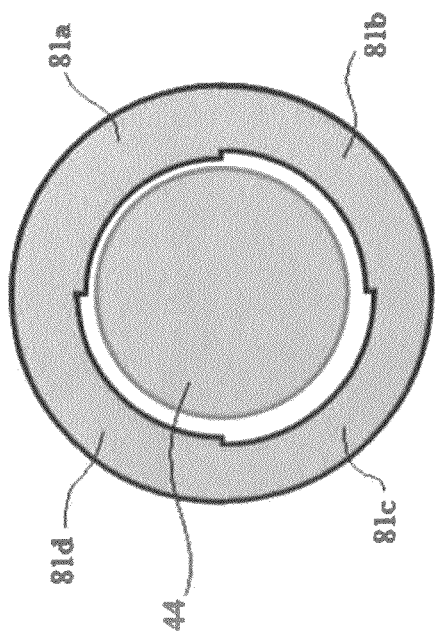
FIG. 8 is a schematic cross sectional top view of a plasma-assisted processing apparatus according to still another embodiment of the present invention.

FIG. 8 is a schematic cross sectional top view of a plasma-assisted processing apparatus according to still another embodiment of the present invention. In this embodiment, the clearance between the outer periphery of the susceptor and the inner periphery of the separation ring are changed along a circumferential direction. The clearance defined between a twelve o'clock direction and a three o'clock direction is the narrowest, the clearance defined between a three o'clock direction and a six o'clock direction and the clearance defined between a nine o'clock direction and a twelve o'clock direction are intermediate, and the clearance defined between a six o'clock direction and a nine o'clock direction is the widest. By this arrangement, the flux of the secondary gas can be adjusted more precisely along a circumferential direction.

EXAMPLES

The present invention will be explained with reference to examples. However, the examples are not intended to limit the present invention.

Reference Example 1

A plasma-enhanced ALD apparatus shown in FIG. 1 was used as a reactor to deposit a film on a substrate under the conditions shown in Table 1 below.

TABLE 1

Deposition step

Figure 9:
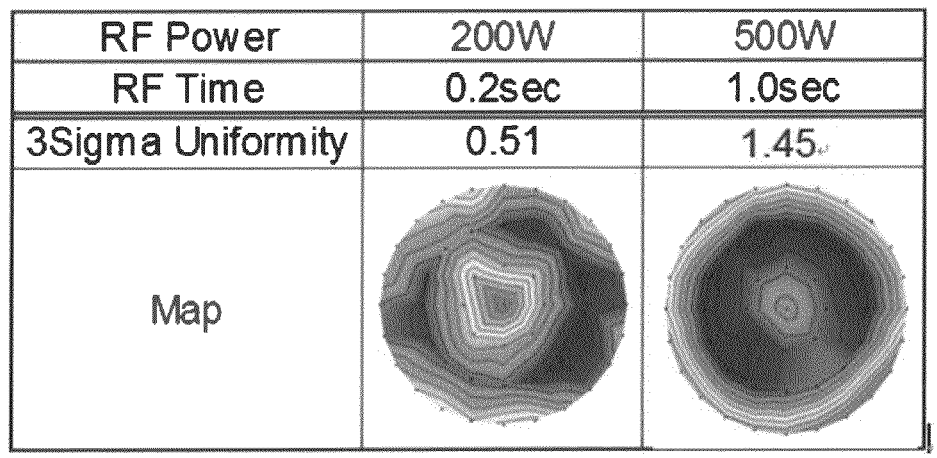
FIG. 9 shows images of thin-film thickness profile measurement by 2D color map analysis of films formed by plasma-enhanced atomic layer deposition (PEALD) under different conditions.

| | |
|---|---|
| Electrodes' gap [mm] | 7.5 |
| Pressure [Pa] | 400 |
| Tem. [° C.] | 300 |
| Precursor | BDEAS (bis(diethylamino)silane) |
| Supply time [sec] | 0.2 |
| Reactant | $O_2$ |
| Gas flow [sccm] | 4,000 (continuous) |
| Rare gas | Ar |
| Gas flow [sccm] | 4,000 (continuous) |
| RF power [W] | See FIG. 9 |
| RF frequency [MHz] | 13.56 |
| Apply time [sec] | See FIG. 9 |
| Purge [sec] | 0.3 between Precursor and RF power |
| Secondary gas supply | |
| Secondary gas | He |
| Gas flow [slm] | 0.2 |
| Clearance [mm] | 0.8 mm all around |

In this example, since the secondary gas flow was not substantial and only for sealing the transfer chamber, no inward flow of the secondary gas after entering the reaction space was expected. Further, the clearance between the susceptor and the separation ring was not narrow enough to increase flux of the secondary gas. The results are shown in FIG. 9. FIG. 9 shows images of thin-film thickness profile measurement by 2D color map analysis of the films formed by PEALD under different conditions shown in FIG. 9. In the images, an area in red represents an area having a relatively higher thickness, whereas an area in blue represents an area having a relatively lower thickness. As can be seen from FIG. 9, when RF power was 500 W and applied for one second per cycle, the 3σ in-plane uniformity of thickness of the film was 1.45 which was significantly higher than 0.51 which was the 3σ in-plane uniformity of thickness of the film deposited when RF power was 200 W and applied for 0.2 seconds per cycle. The 2D map images show that when higher and longer RF power was applied, the film surface became concave wherein the thickness of the film in an area around the outer periphery of the substrate became greater than that of the film in middle and center areas.

Reference Example 2

Films were deposited under the conditions which were the same as in Reference Example 1 except for the following shown in Table 2.

TABLE 2

| | | RF Power (W) | | | |
|---|---|---|---|---|---|
| | | 50 | 200 | 500 | 800 |
| RF Time (sec) | 0.2 | convex | convex | convex | flat |
| | 0.5 | convex | convex | flat | concave |
| | 1 | flat | flat | concave | concave |

As can be seen from Table 2, as shown in Reference Example 1, when higher and longer RF power was applied, the film surface became concave wherein the thickness of the film in an area around the outer periphery of the substrate became greater than that of the film in middle and center areas.

Example 1

Films were deposited under conditions similar to those in Reference Example 1 as shown in Table 3.

TABLE 3

Deposition step (PEALD)

Figure 10:
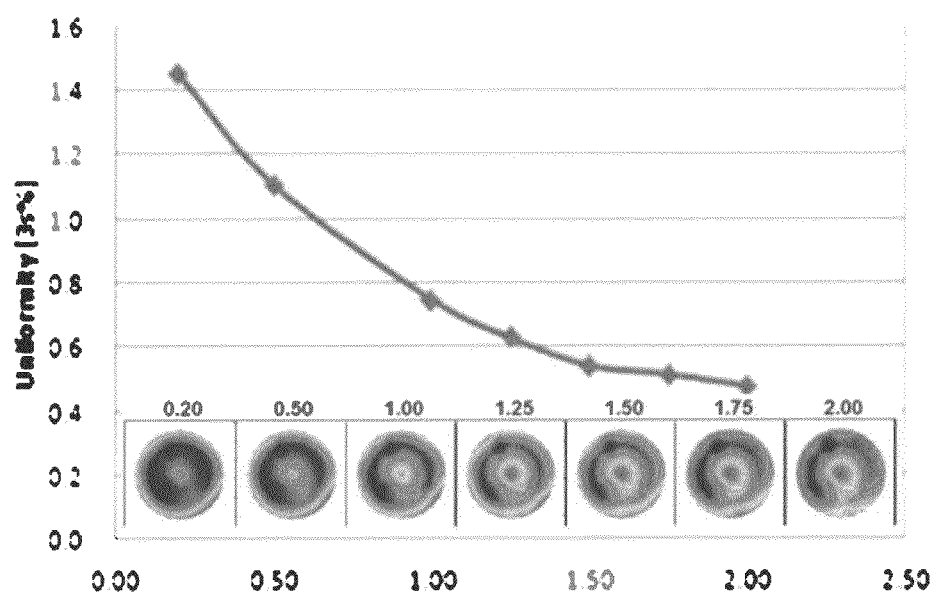
FIG. 10 shows the relationship between in-plane uniformity of deposition and flow rate of secondary gas, with images of thin-film thickness profile measurement by 2D color map analysis of the deposited films.

| | |
|---|---|
| Electrodes' gap [mm] | 7.5 |
| Pressure [Pa] | 400 |
| Tem. [° C.] | 300 |
| Precursor | BDEAS |
| Supply time [sec] | 0.2 |
| Reactant | $O_2$ |
| Gas flow [sccm] | 3,000 (continuous) |
| Rare gas | Ar |
| Gas flow [sccm] | 8,000 (continuous) |
| RF power [W] | 500 |
| RF frequency [MHz] | 13.56 |
| Apply time [sec] | 1.0 |
| Purge [sec] | 0.3 between Precursor and RF power |
| Secondary gas supply | |
| Secondary gas | He |
| Gas flow [slm] | See FIG. 10 |
| Clearance [mm] | 0.8 (all around) |

In this example, the flow rate of the secondary gas was changed, and as a result, surprisingly, the 3σ in-plane uniformity of thickness of the film was significantly improved as shown in FIG. 10 by increasing the flow of the secondary gas. FIG. 10 shows the relationship between in-plane uniformity of deposition and flow rate of control gas, with images of thin-film thickness profile measurement by 2D color map analysis of the deposited films. As can be seen from FIG. 10, the in-plane uniformity of thickness of the film was significantly improved, and also the thickness of the film in central and intermediate areas of the substrate increased as the flow of the secondary gas increased from zero to 2.00 slm.

Example 2

Photoresist films were etched using the same apparatus as in Example 1 under conditions shown in FIG. 4.

TABLE 4

Figure 11:
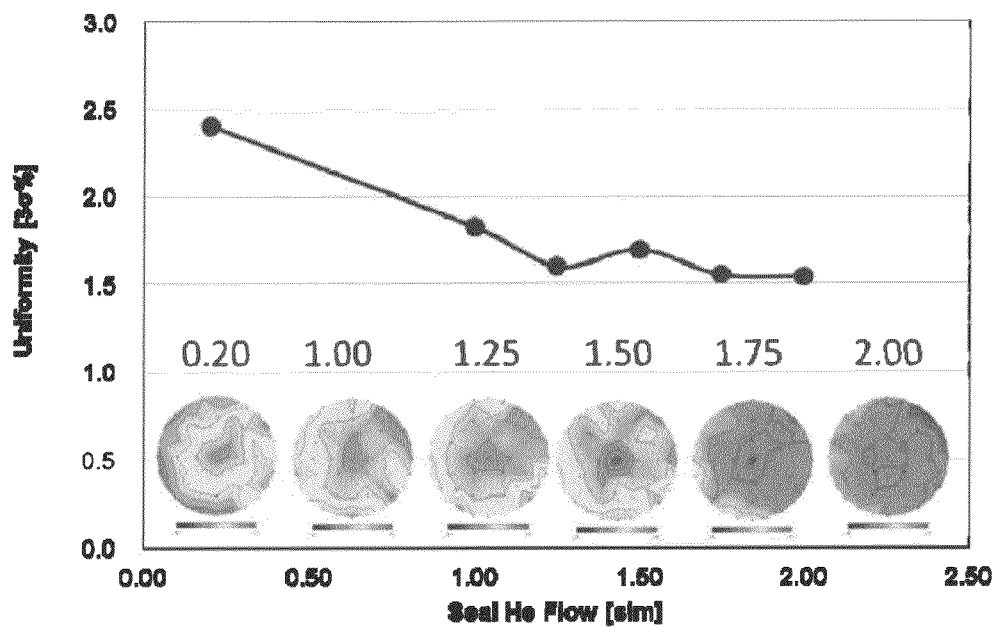
FIG. 11 shows the relationship between in-plane uniformity of trimming and flow rate of secondary gas, with images of thin-film thickness profile measurement by 2D color map analysis of the trimmed films.

| Etching step | |
| --- | --- |
| Electrodes' gap [mm] | 13 |
| Pressure [Pa] | 200 |
| Tem. [° C.] | 75 |
| Reactant | $O_2$ |
| Gas flow [sccm] | 600 |
| Rare gas | Ar |
| Gas flow [sccm] | 500 |
| RF power [W] | 60 |
| RF frequency [MHz] | 13.56 |
| Total duration [sec] | 5 |
| Secondary gas supply | |
| Secondary gas | He |
| Gas flow [slm] | See FIG. 11 |
| Clearance [mm] | 1 (all around) |

In this example, the flow rate of the secondary gas was changed, and as a result, surprisingly, the 3σ in-plane uniformity of thickness of the film was significantly improved as shown in FIG. 11 by increasing the flow of the secondary gas. FIG. 11 shows the relationship between in-plane uniformity of trimming and flow rate of control gas, with images of thin-film thickness profile measurement by 2D color map analysis of the trimmed films. As can be seen from FIG. 11, the in-plane uniformity of thickness of the film was significantly improved, and also the thickness of the film in central and intermediate areas of the substrate decreased as the flow of the secondary gas increased from zero to 2.00 slm.

Example 3

Films were deposited using the apparatus illustrated in FIG. 1 under conditions shown in Table 5.

TABLE 5

| Deposition step (PECVD) | |
| --- | --- |
| Electrodes' gap [mm] | 8.5 |
| Pressure [Pa] | 210 |
| Tem. [° C.] | 350 |
| Precursor | TEOS |
| Gas flow [sccm] | 70 |
| Reactant | $O_2$ |
| Gas flow [sccm] | 5,000 |
| Rare gas | He |
| Gas flow [sccm] | 600 |
| HRF power [W] | 350 |
| RF frequency [MHz] | 13.56 |
| LRF power [W] | 50 |
| RF frequency [kHz] | 400 |
| Secondary gas supply | |
| Secondary gas | He |
| Gas flow [slm] | See FIG. 12 |
| Clearance [mm] | See FIG. 12 (all around) |

In this example, separation rings having different clearances (5 mm and 10 mm) between the susceptor and the separation ring were used, and the flow rate of the secondary gas was changed. As a result, surprisingly, the 3σ in-plane uniformity of thickness of the film was significantly improved as shown in FIG. 12 by increasing the flow of the secondary gas when the clearance was 5 mm, but not when the clearance was 10 mm. FIG. 12 shows images of thin-film thickness profile measurement by 2D color map analysis of films formed by plasma-enhanced atomic layer deposition (PECVD) under different conditions. As can be seen from FIG. 12, the in-plane uniformity of thickness of the film was significantly improved, and also the thickness of the film in a peripheral area of the substrate decreased as the flow of the secondary gas increased, when the clearance was 5 mm, not when the clearance was 10 mm. In this example, it can be said that preferably the flow rate of the secondary gas is 600 sccm or higher because the in-plane uniformity can be as good as about 2%, when the clearance is 5 mm. However, the preferable ranges vary depending on the required uniformity, the configuration of the reactor, the deposition conditions, etc., and a skilled artisan can readily determine optimal conditions based on this disclosure through routine work.

Example 4

Films were deposited under conditions similar to those in Example 1 as shown in Table 6.

TABLE 6

Figure 13:
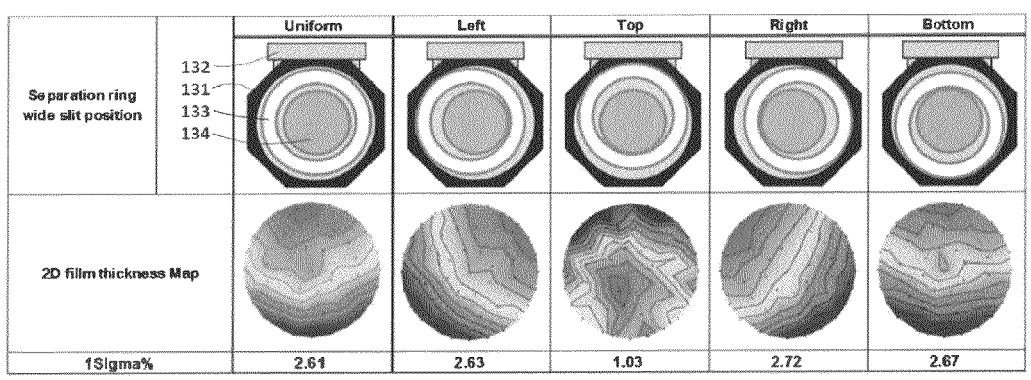
FIG. 13 shows images of thin-film thickness profile measurement by 2D color map analysis of films formed by plasma-enhanced atomic layer deposition (PEALD) using a separation ring having its center shifted in four directions.

| Deposition step (PEALD) | |
| --- | --- |
| Electrodes' gap [mm] | 7.5 |
| Pressure [Pa] | 400 |
| Tem. [° C.] | 300 |
| Precursor | BDEAS |
| Supply time [sec] | 0.3 |
| Reactant | $O_2$ |
| Gas flow [sccm] | 500 (continuous) |
| Rare gas | Ar |
| Gas flow [sccm] | 2,000 (continuous) |
| RF power [W] | 200 |
| RF frequency [MHz] | 13.56 |
| Apply time [sec] | 1.0 |
| Purge [sec] | 0.3 between Precursor and RF power |
| Secondary gas supply | |
| Secondary gas | He |
| Gas flow [slm] | 0.3 |
| Clearance [mm] | See FIG. 13 |

In this example, the center of the separation ring was shifted in four directions as shown in FIG. 13. FIG. 13 shows images of thin-film thickness profile measurement by 2D color map analysis of films formed by plasma-enhanced atomic layer deposition (PEALD) using a separation ring having its center shifted in four directions. Before shifting ("Uniform" in FIG. 13), the clearance of the separation ring was 2 mm (all around). A separation ring 133 was shifted relative to a substrate 134 (the substrate and a reaction chamber 131 were centered) to the right of a gate valve 132 ("Right" in FIG. 13), to the left of the gate valve ("Left" in FIG. 13), away from the gate valve ("Bottom" in FIG. 13), and closer to the gate valve ("Top" in FIG. 13). By shifting, the clearance was changed from 2 mm to 0.5 mm as the closest clearance, and to 3.5 mm as the widest clearance. As can be seen from FIG. 13, when the separation ring was shifted closer to the gate valve, the in-plane uniformity of thickness of the film was surprisingly improved to about 1%, and also an area where the film was relatively thicker was moved from one peripheral side of the substrate to a central area of the substrate.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for controlling in-plane uniformity of a substrate processed by plasma-assisted process in a reactor comprising: a susceptor and a showerhead disposed in parallel facing each other and conductively coupled for plasma discharge in a reaction space formed between the susceptor and the showerhead; and an annular duct circularly surrounding the susceptor, said method comprising:

supplying a principal gas for plasma-assisted process of a substrate placed on the susceptor, to the reaction space through the showerhead, and discharging radially the principal gas from the reaction space through the annular duct; and while supplying the principal gas to the reaction space, supplying a secondary gas to the reaction space from an area in close proximity to an outer periphery of the susceptor, outside an outer circumference of the substrate as viewed from above, so as to flow at least partially in an inward direction passing the outer circumference of the substrate, reversing the direction of the secondary gas to flow toward the annular duct in a vicinity of the outer circumference of the substrate, and discharging radially the secondary gas together with the principal gas from the reaction space through the annular duct, wherein the reactor comprises a reaction chamber and a transfer chamber under the reaction chamber, wherein the reaction chamber and the transfer chamber are separated by a separation ring having an opening in which the susceptor is disposed and a top surface of the susceptor is approximately flush with the separation ring during the plasma-assisted process, wherein an outer diameter of the susceptor is smaller than the opening of the separation ring, forming a vertically-opened clearance between the separation ring and the susceptor, and an entire top surface of the separation ring forms a bottom of the annular duct during the plasma-assisted process, wherein the secondary gas is supplied to the reaction space through the clearance between the separation ring and the susceptor at a flow rate such that the secondary gas enters the reaction space partially in the inward direction passing the outer circumference of the substrate, reverses direction to flow toward the annular duct in a vicinity of the outer circumference of the substrate, and is discharged radially together with the principal gas from the reaction space through the annular duct.

2. The method according to claim 1, wherein the vertically-opened clearance is defined by a distance between the inner periphery of the separation ring and the outer periphery of the susceptor, which distance varies along the outer periphery of the susceptor to change the flow rate of the secondary gas along the outer periphery of the susceptor.

3. The method according to claim 2, wherein the clearance between the inner periphery of the separation ring and the outer periphery of the susceptor is no less than 0.5 mm but less than 10 mm.

4. The method according to claim 1, wherein the clearance between the inner periphery of the separation ring and the outer periphery of the susceptor is no less than 0.5 mm but less than 10 mm.

5. The method according to claim 4, wherein the secondary gas is supplied at a flow rate of about 500 sccm or higher.

6. A method for controlling in-plane uniformity of a substrate processed by plasma-assisted process in a reactor comprising: a susceptor and a showerhead disposed in parallel facing each other and conductively coupled for plasma discharge in a reaction space formed between the susceptor and the showerhead; and an annular duct circularly surrounding the susceptor, said method comprising:

supplying a principal gas for plasma-assisted process of a substrate placed on the susceptor, to the reaction space through the showerhead, and discharging radially the principal gas from the reaction space through the annular duct; and while supplying the principal gas to the reaction space, supplying a secondary gas to the reaction space from an area in close proximity to an outer periphery of the susceptor, outside an outer circumference of the substrate as viewed from above, so as to flow at least partially in an inward direction passing the outer circumference of the substrate, reversing the direction of the secondary gas to flow toward the annular duct in a vicinity of the outer circumference of the substrate, and discharging radially the secondary gas together with the principal gas from the reaction space through the annular duct, wherein the reactor comprises a reaction chamber and a transfer chamber under the reaction chamber, wherein the reaction chamber and the transfer chamber are separated by a separation ring having an opening in which the susceptor is disposed and a top surface of the susceptor is approximately flush with the separation ring during the plasma-assisted process, wherein the secondary gas is supplied to the reaction space through a clearance between the separation ring and the susceptor at a flow rate such that the secondary gas enters the reaction space partially in the inward direction passing the outer circumference of the substrate, reverses direction to flow toward the annular duct in a vicinity of the outer circumference of the substrate, and is discharged radially together with the principal gas from the reaction space through the annular duct, wherein the clearance between the separation ring and the susceptor varies along the outer periphery of the susceptor to change the flow rate of the secondary gas along the outer periphery of the susceptor, wherein a center of the separation ring is shifted from a center of the susceptor toward a gate valve disposed in a side wall of the transfer chamber, through which gate valve the substrate is taken into and out of the transfer chamber.

7. The method according to claim 6, wherein the secondary gas is an inert gas or an oxidizing gas.

8. The method according to claim 6, wherein the plasma-assisted process is plasma-enhanced atomic layer deposition (PEALD) or plasma-enhanced chemical vapor deposition (PECVD).

9. The method according to claim 6, wherein the plasma-assisted process is plasma-assisted etching or ashing.

10. The method according to claim 6, wherein the in-plane uniformity of the substrate is such that in-plane uniformity of thickness of a processed film of the substrate is about 2%.

* * * * *